United States Patent
Kamata et al.

(10) Patent No.: US 9,236,135 B2
(45) Date of Patent: Jan. 12, 2016

(54) SEMICONDUCTOR STORAGE DEVICE HAVING A VOLTAGE GENERATOR

(71) Applicant: KABUSHIKI KAISHA TOSHIBA, Minato-ku, Tokyo (JP)

(72) Inventors: Yoshihiko Kamata, Yokohama Kanagawa (JP); Yuko Yokota, Kamakura Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/483,877

(22) Filed: Sep. 11, 2014

(65) Prior Publication Data

US 2015/0262691 A1   Sep. 17, 2015

Related U.S. Application Data

(60) Provisional application No. 61/953,524, filed on Mar. 14, 2014.

(51) Int. Cl.
*G11C 7/22* (2006.01)
*G11C 16/26* (2006.01)
*G11C 16/14* (2006.01)
*G11C 16/34* (2006.01)

(52) U.S. Cl.
CPC ............... *G11C 16/26* (2013.01); *G11C 16/14* (2013.01); *G11C 16/3445* (2013.01)

(58) Field of Classification Search
CPC .... G11C 16/26; G11C 16/10; G11C 11/5642; G11C 16/344; G11C 11/5628
USPC .............. 365/189.14, 189.09, 185.14, 185.22
See application file for complete search history.

(56) References Cited

U.S. PATENT DOCUMENTS

| | | | |
|---|---|---|---|
| 2005/0078524 A1* | 4/2005 | Hosono | G11C 16/344 365/185.22 |
| 2013/0094294 A1* | 4/2013 | Kwak et al. | H01L 27/1157 365/185.03 |
| 2015/0221387 A1* | 8/2015 | Nam | G11C 16/0483 365/185.02 |

* cited by examiner

*Primary Examiner* — Tuan T Nguyen
(74) *Attorney, Agent, or Firm* — Holtz, Holtz, Goodman & Chick PC

(57) ABSTRACT

According to one embodiment, a nonvolatile semiconductor storage device includes a memory cell, a voltage generator configured to output a first voltage and a second voltage, and a controller. The controller executes a write operation, which includes a first read operation, a program operation, and a verify operation. The controller executes the first read operation before the program operation and the verify operation. The controller executes the first read operation by applying the first voltage to a gate of the memory cell. The controller executes an erase verify operation by applying the second voltage to the gate of the memory cell. The first voltage is higher than the second voltage.

4 Claims, 15 Drawing Sheets

NAND Flash Memory

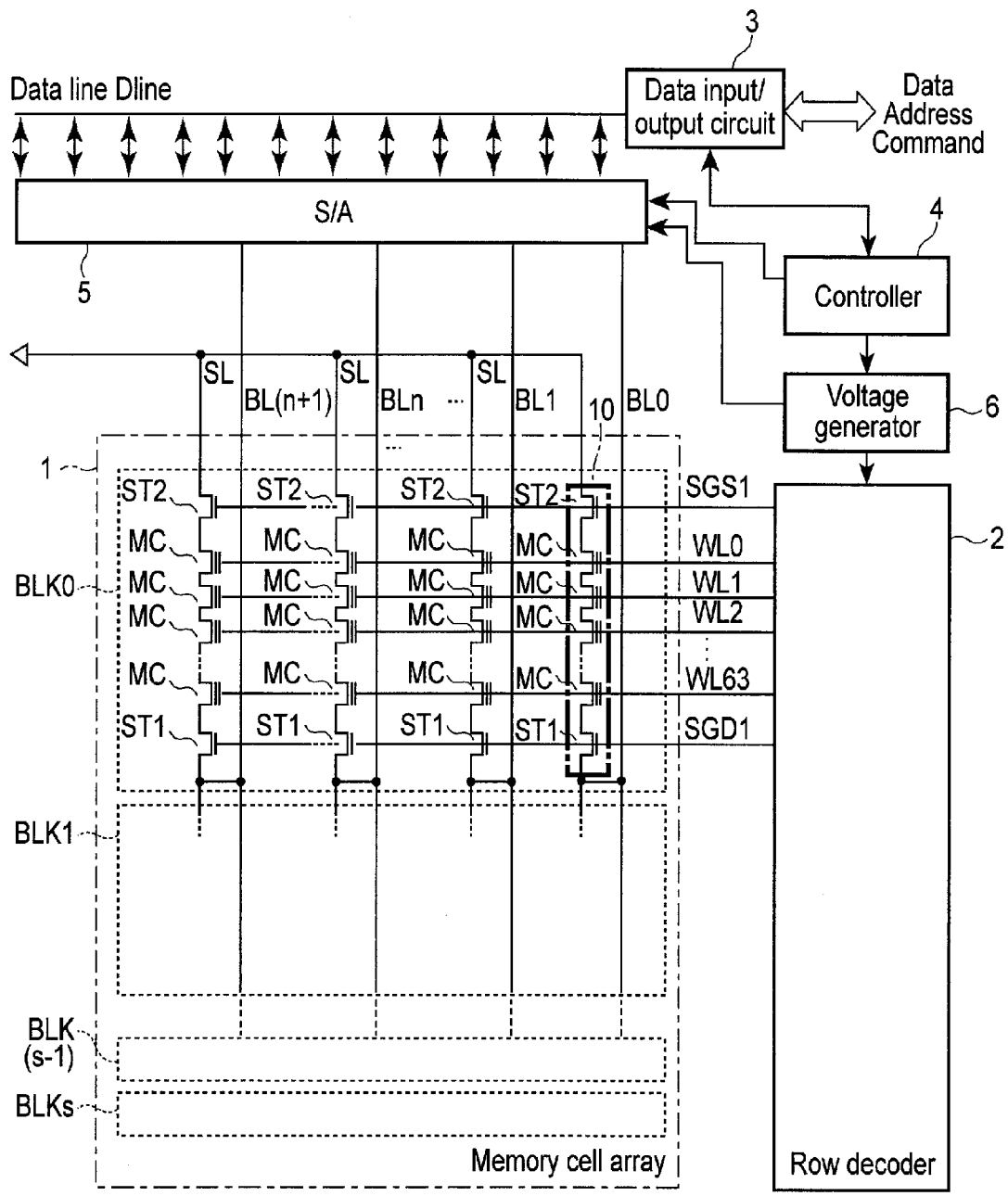
F I G. 1

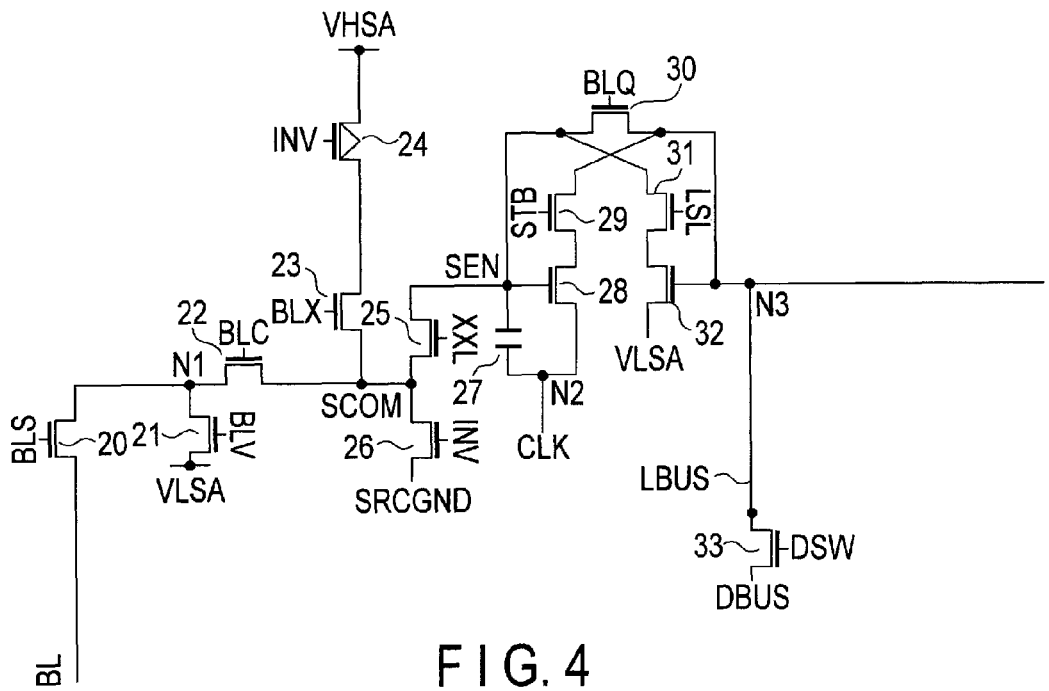
FIG. 4
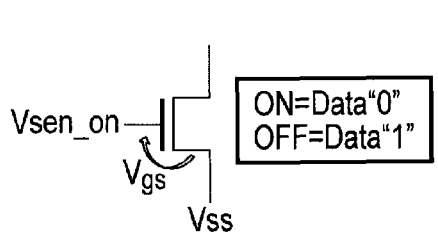
Data"1"=OFF condition of NMOS
$V_{gs}=V_{sen\_on}-V_{ss}<V_{thn}$
$(C_{sen} \cdot V_{sen}-I_{th} \cdot T_{sense})/C_{sen}<V_{thn}$
FIG. 5A
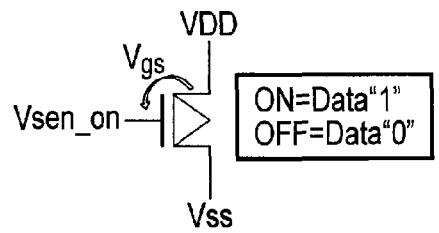
Data"1"=ON condition of PMOS
$V_{gs}=VDD-V_{sen\_on}>V_{thp}$
$VDD-(C_{sen} \cdot V_{sen}-I_{th} \cdot T_{sense})/C_{sen}>V_{thp}$
(Initial charge $V_{SEN}$ of SEN=VDD)
∴ $I_{th} \cdot T_{sense}/C_{sen}>V_{thp}$
FIG. 5B
|  | SEN | F_SENSE | Ith |
|---|---|---|---|
| Pattern I | V2 | T2 | Icell2 |
| Pattern II | V1(>V2) | T1(>T2) | Icell1 |
| Pattern III | V1(>V2) | T2 | Icell2 |
FIG. 6

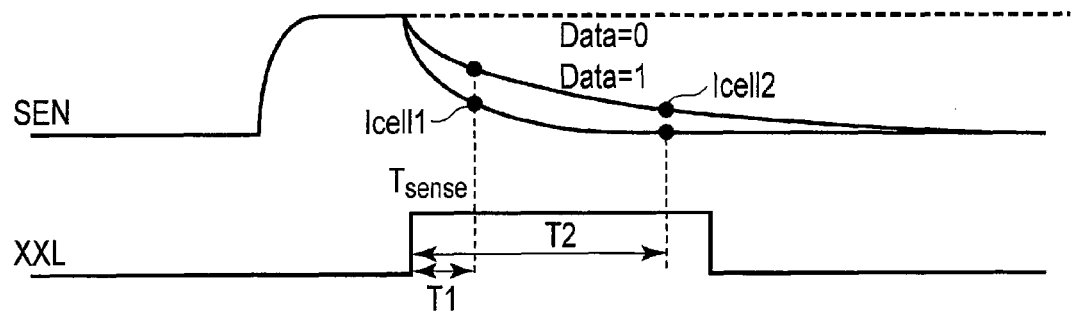
FIG. 7
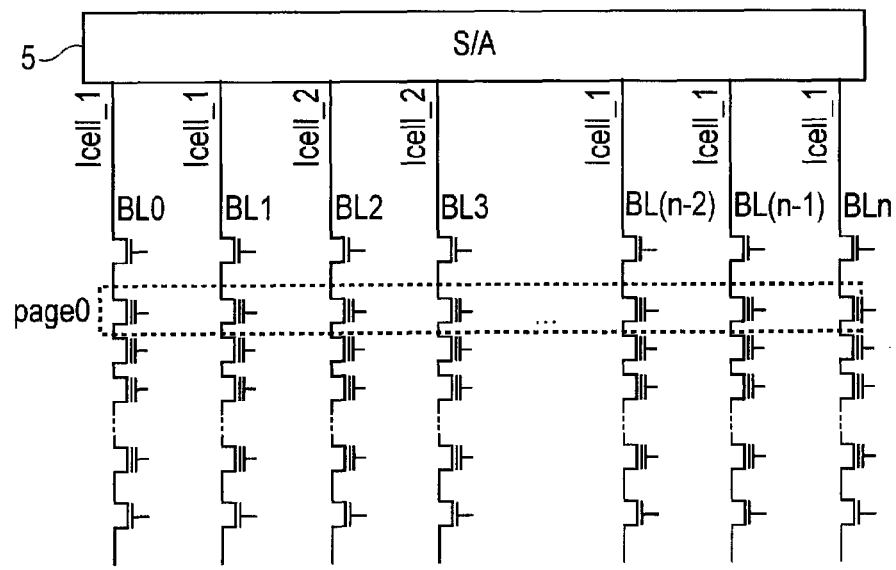
FIG. 8
| Flag | Vpgm | Vera |
|------|------|------|
| H | Vpgm1(H) | Vera2(L) |
| L | Vpgm2(L) | Vera2(H) |
FIG. 9

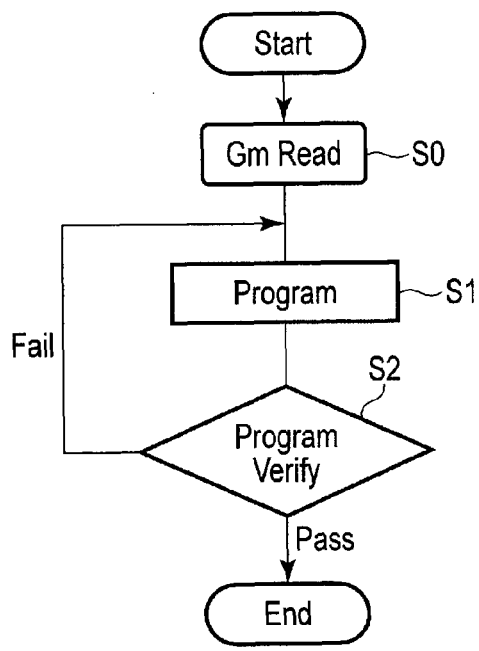
F I G. 10
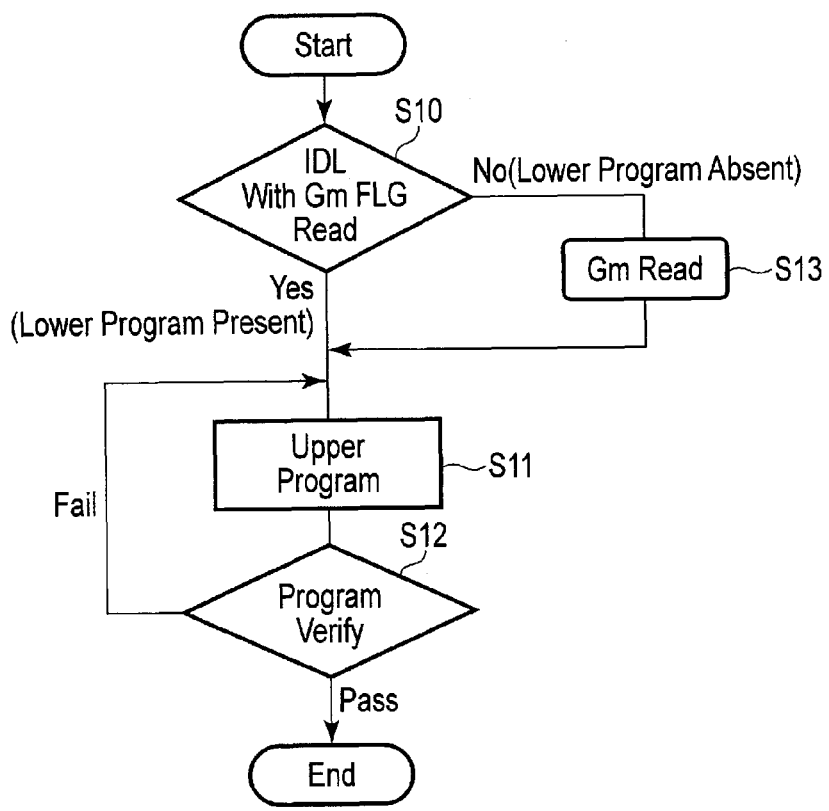
F I G. 13

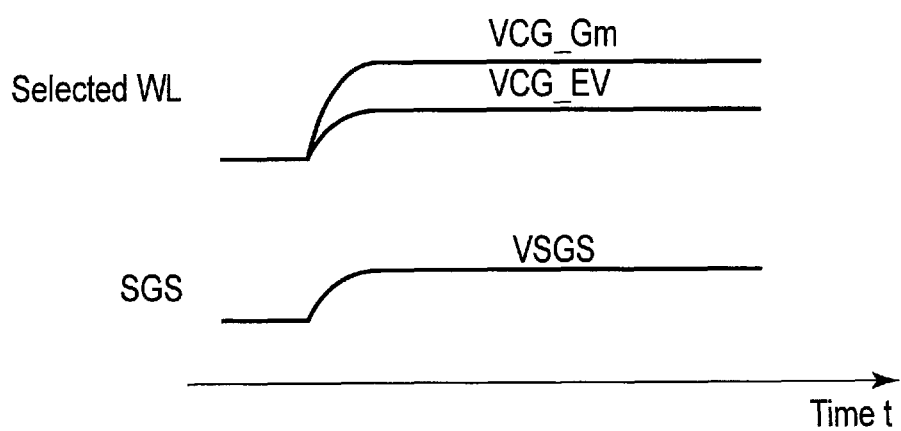
F I G. 12

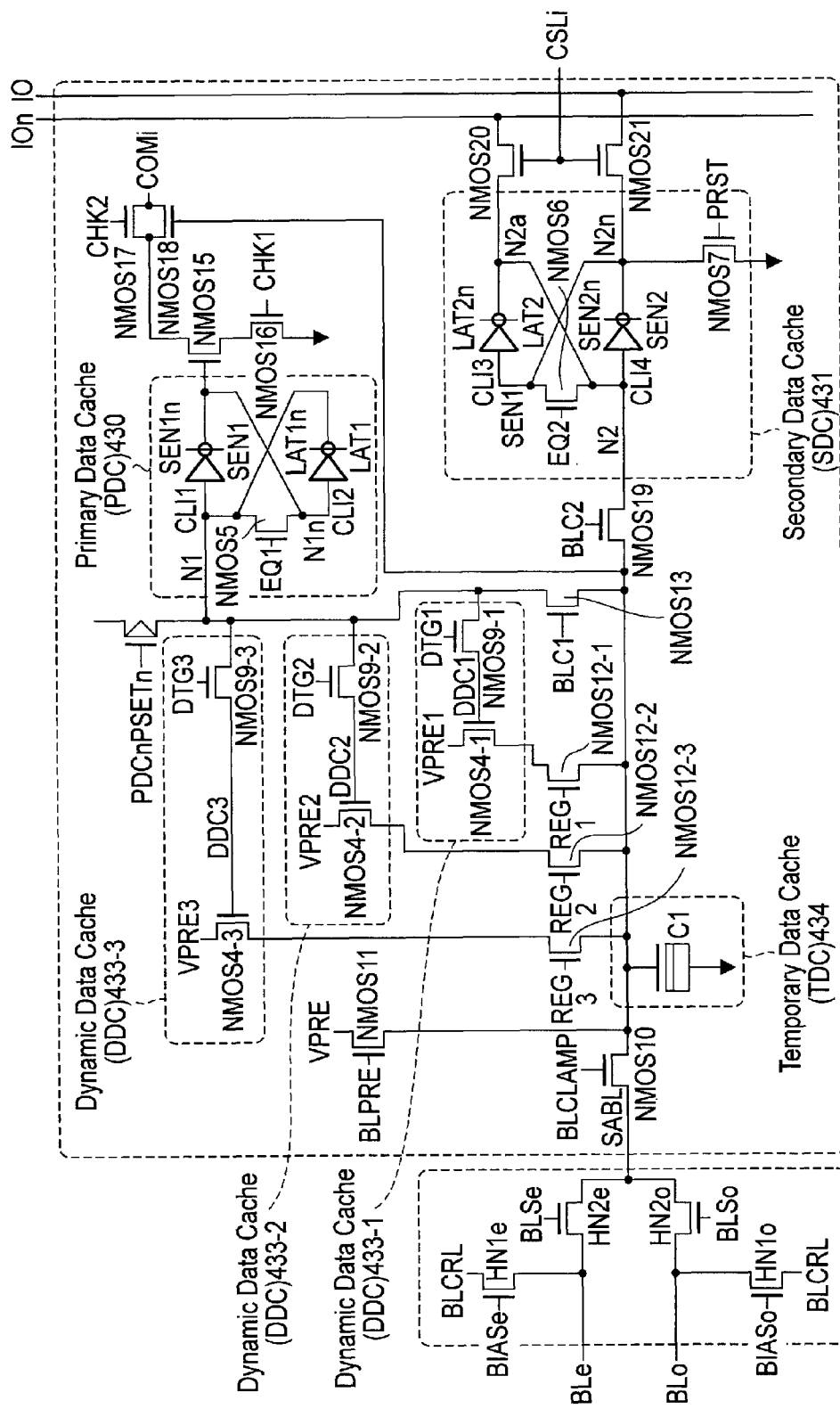
F I G. 14

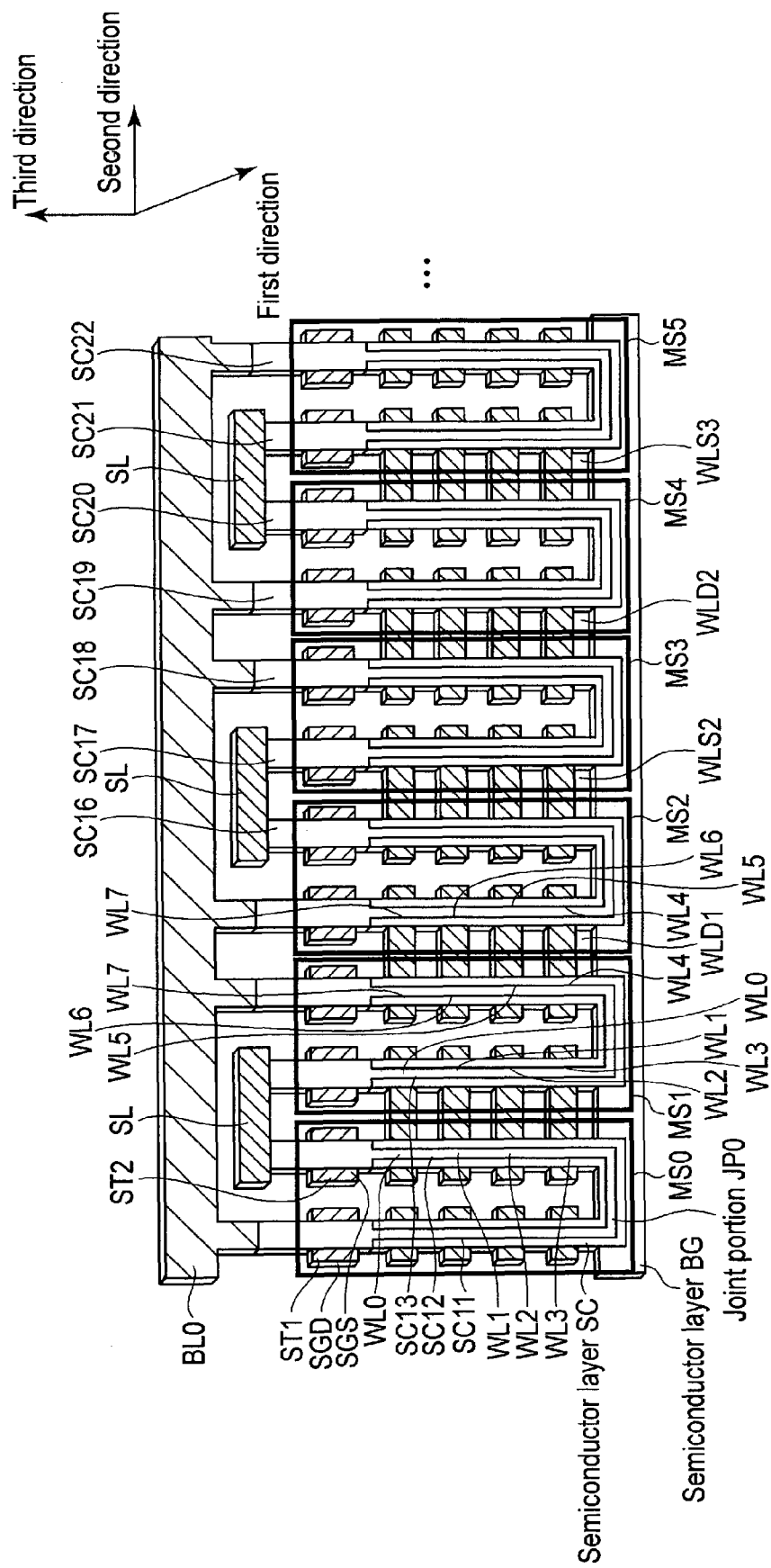
F I G. 16

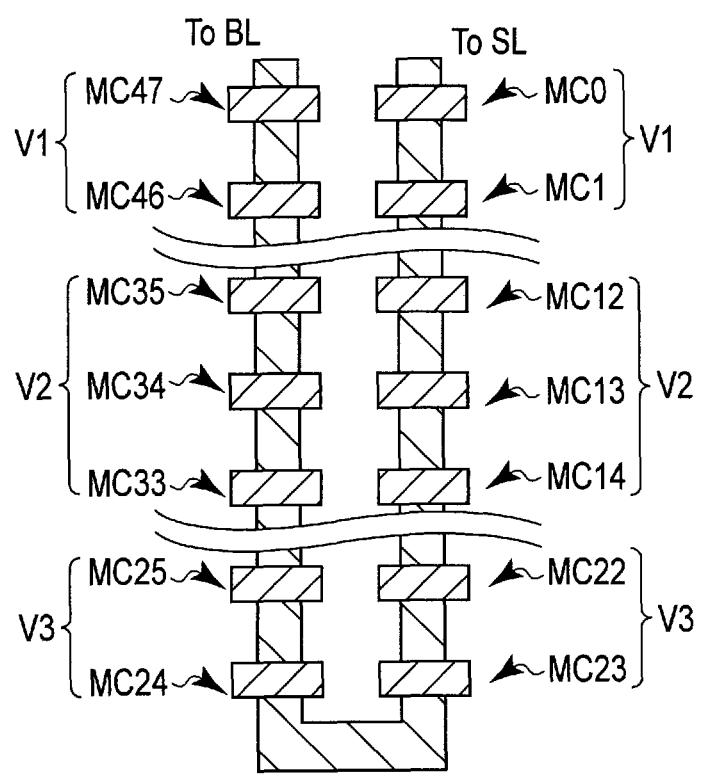
F I G. 17

SEMICONDUCTOR STORAGE DEVICE HAVING A VOLTAGE GENERATOR

CROSS-REFERENCE TO RELATED APPLICATIONS

This application claims the benefit of U.S. Provisional Application No. 61/953,524, filed Mar. 14, 2014, the entire contents of which are incorporated herein by reference.

FIELD

Embodiments described herein relate generally to a nonvolatile semiconductor storage device.

BACKGROUND

A NAND flash memory includes, e.g., memory cells arranged in a matrix, and a sense amplifier which causes this memory cell to hold program data.

BRIEF DESCRIPTION OF THE DRAWINGS

FIG. 1 is a view showing the overall arrangement of a nonvolatile semiconductor storage device according to the first embodiment;

FIG. 4 shows the arrangement of a sense amplifier according to the first embodiment;

FIGS. 5A and 5B show conceptual views of the ON/OFF conditions of a sensor according to the first embodiment;

FIG. 6 is a conceptual view showing the relationship between a sense time and reference current according to the first embodiment;

FIG. 7 is a timing chart showing a read operation according to the first embodiment;

FIG. 8 is a conceptual view showing a read operation of obtaining flag information according to the first embodiment;

FIG. 9 shows a correspondence table of the flag information, a program voltage, and an erase voltage according to the first embodiment;

FIG. 10 is a flowchart showing a write operation according to the first embodiment;

FIG. 12 is a timing chart showing a write operation according to the first modification of the first embodiment;

FIG. 13 is a flowchart showing a write operation according to the first modification of the first embodiment;

FIG. 14 shows the arrangement of a sense amplifier according to the first modification of the first embodiment;

FIG. 16 is a sectional view of a memory cell array according to the second embodiment;

FIG. 17 is a conceptual view of a write operation according to the second embodiment;

DETAILED DESCRIPTION

Figure 2:
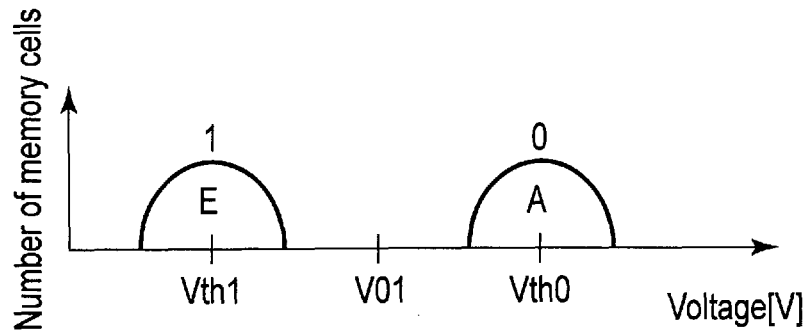
FIG. 2 shows a memory cell threshold distribution according to the first embodiment.

Embodiments will be explained below with reference to the accompanying drawings. In this explanation, the same reference numerals denote the same parts throughout the drawings. However, it should be noted that the drawings are schematic views, so the relationship between the thickness and the planar dimension, the ratio of the thickness of each layer, and the like are different from actual ones. Accordingly, practical thicknesses and dimensions should be judged by referring to the following explanation. Also, the individual drawings of course contain portions having different dimensional relationships and different ratios.

In general, according to one embodiment, a nonvolatile semiconductor storage device comprises a memory cell; a voltage generator configured to output a first voltage and a second voltage; and a controller. The controller is configured to execute a write operation. The write operation includes a first read operation, a program operation, and a verify operation. The controller is configured to execute the first read operation before the program operation and the verify operation. The controller is configured to execute the first read operation by applying the first voltage to a gate of the memory cell. The controller is configured to execute an erase verify operation by applying the second voltage to the gate of the memory cell. The first voltage is higher than the second voltage.

First Embodiment

In the first embodiment, flag information is generated based on an electric current flowing through a memory cell MC having a threshold level in an erased state, and a program voltage and erase voltage optimized based on this flag information are applied to the memory cell MC.

In the first embodiment, this flag information is stored in a management area for each page.

1. Overall Configuration Example

As shown in FIG. 1, a semiconductor storage device according to this embodiment includes a memory cell array 1, row data 2, data input/output circuit 3, controller 4, sense amplifier 5, and voltage generator 6.

1-1. Configuration Example of Memory Cell Array 1

The memory cell array 1 includes blocks BLK0 to BLKs (s is a natural number) each including a plurality of nonvolatile memory cells MC. Each of the blocks BLK0 to BLKs includes a plurality of NAND strings 10 in each of which the nonvolatile memory cells MC are connected in series.

Each NAND string 10 includes, e.g., 64 memory cells MC, and selection transistors ST1 and ST2.

The memory cell MC can hold data having two values or more. The structure of the memory cell MC is an FG structure. Note that the structure of the memory cell MC may also be a MONOS structure.

The memory cell MC includes a control gate electrically connected to a word line, a drain electrically connected to a bit line, and a source electrically connected to a source line. Also, the memory cell MC is an n-channel MOS transistor.

Note that the number of memory cells MC is not limited to 64, and may also be 128, 256, 512, or the like. That is, the number of memory cells MC is not limited.

Adjacent memory cells MC share the source and drain. The memory cells MC are arranged between the selection transistors ST1 and ST2 such that the current paths of the memory cells MC are connected in series. The drain region at one end of the series-connected memory cells MC is connected to the source region of the selection transistor ST1, and the source region at the other end is connected to the drain region of the selection transistor ST2.

The control gates of the memory cells MC in the same row are connected together to one of word lines WL0 to WL63. The gate electrodes of the selection transistors ST1 and ST2 of the memory cells MC in the same row are connected together to select gate lines SGD1 and SGS1, respectively.

To simplify the explanation, the word lines WL0 to WL63 will simply be referred to as word lines WL when it is unnecessary to distinguish between them.

The drains of the selection transistors ST1 in the same column in the memory cell array 1 are connected together to one of bit lines BL0 to BLn. The bit lines BL0 to BLn will also be referred to as bit lines BL when it is unnecessary to distinguish between them (n: natural number). The sources of the selection transistors ST2 are connected together to a source line SL.

Furthermore, data is simultaneously programmed in a plurality of memory cells MC connected to the same word line WL, and this unit will be called a page.

This data contains user data and management data. The user data is net program data and net read data.

On the other hand, the management data is data generated based on the characteristics of the memory cells MC formed in the same page as described above, and is called "flag information" in the first embodiment. For example, this flag information indicates whether the memory cell MC has deteriorated (whether read, program, and erase have been performed on the memory cell MC a plurality of number of times).

Also, data is simultaneously erased from a plurality of memory cells MC of each block BLK.

1-2. Threshold Distribution of Memory Cells MC

The threshold distribution of the above-mentioned memory cells MC will be explained with reference to FIG. 2. FIG. 2 is a graph showing the threshold distribution (voltage) on the abscissa, and the number of memory cells MC on the ordinate.

As shown in FIG. 2, each memory cell MC can hold, e.g., binary (2-levels) data (1-bit data).

The memory cell MC can hold 1-bit data which is data "0" (level A) or data "1" (level E) in accordance with the threshold value.

The memory cell MC is set to data "1" (e.g., a negative voltage) in an erased state, and is set at a positive threshold voltage when data is programmed and electric charge is injected into a charge storage layer.

Note that quaternary processing will be described later.

1-2-1. Cell Current Icell

Figure 3:
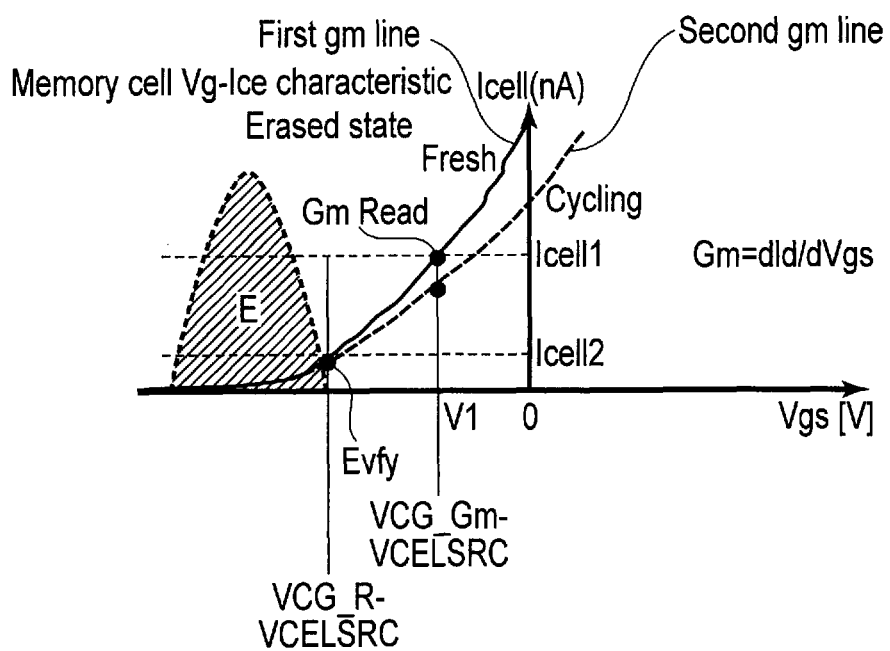
FIG. 3 is a graph showing the current-voltage characteristics according to the first embodiment.

A voltage Vgs to be applied to the gate-to-source path of the memory cell MC having a threshold value positioned at an erase level and an electric current (Icell) flowing through the channel of the memory cell MC will be explained with reference to FIG. 3. FIG. 3 is a graph showing the voltage Vgs on the abscissa, and the cell current Icell on the ordinate.

The characteristic of the memory cell MC changes when a write operation and erase operation are repeated. A good characteristic of a memory cell before the write operation and erase operation are repeated and a deteriorated characteristic of a memory cell after the write operation and erase operation are repeated many times are different. When an erase-verify voltage is applied to a memory cell having a good characteristic and a memory cell having a deteriorated characteristic in the erased state, both the memory cells allow cell current Icell2 to flow (see first and second gm lines in FIG. 3).

When the value of Vgs is increased, a channel forms in the memory cell MC, and an electric current flows. When the memory characteristic is good, the electric current steeply rises with respect to the voltage Vgs (the first gm line in FIG. 3). In other words, the slope of the electric current is large.

By contrast, when the memory characteristic has deteriorated, the rise in electric current is not so steep as the first gm line with respect to the voltage Vgs (the second gm line in FIG. 3). In other words, the slope of the electric current is small.

When voltage Vgs=voltage V1, the memory cell MC (the first Gm line) having the good characteristic allows Icell2 to flow, but the memory cell MC (the second gm line) having no good characteristic allows an electric current smaller than Icell1 to flow.

Assuming that Icell1 is a reference current which divides "0" and "1", the memory cell MC which allows Icell1 or more to flow will be called an ON cell, and the memory cell MC which allows an electric current lower than Icell1 to flow will be called an OFF cell.

As described above, when Icell1 is the reference current, for example, the amount of ON cells (or OFF cells) existing in one page is the index of the deterioration degree of the memory cell MC.

A read method using the memory cell MC having the above-mentioned erase level will be called gm read in some cases hereinafter.

Note that as shown in FIG. 3, the voltage of the upper end of an erase-level threshold distribution is a voltage Evfy (<V1).

1-3. Row Decoder 2

The row decoder 2 will be explained with reference to FIG. 1 again. In a data write operation, data read operation, and data erase operation, the row decoder 2 decodes a block selection signal supplied from the controller 4, and selects a block BLK based on the decoding result.

Then, the row decoder 2 supplies a program voltage, read voltage, or erase voltage to the selected block BLK.

More specifically, as program voltages, the row decoder 2 supplies a selected program voltage (to be referred to as a voltage Vpgm hereinafter) to the memory cell MC as a program target, and supplies an unselected program voltage (to be referred to as a voltage Vpass hereinafter) to other memory cells MC.

Also, as read voltages, the row decoder 2 supplies a selected read voltage (to be referred to as Vcgr hereinafter) to the memory cell MC as a read target, and supplies an unselected read voltage (to be referred to as a voltage Vread hereinafter) to other memory cells MC.

In an erase operation, the row decoder 2 supplies 0 V to the word line WL.

1-4. Data Input/Output Circuit 3

The data input/output circuit 3 outputs, to the controller 4, an address and command supplied from a host via an I/O terminal (not shown).

The data input/output circuit 3 also outputs program data to the sense amplifier 5 via a data line $D_{line}$.

When outputting data to the host, the data input/output circuit 3 receives data amplified by the sense amplifier 5 via the data line $D_{line}$, and outputs the data to the host via the I/O terminal, under the control of the controller 4.

1-5. Voltage Generator 6

The voltage generator 6 generates a read voltage and write voltage.

The read voltage includes a voltage VREAD to be supplied to an unselected word line WL, a voltage VCGR to be supplied to a selected word line WL, a Gm-read voltage VCG_GM, and a voltage VCG_EV for verifying the upper-end portion of the threshold distribution in an erased state.

The voltage VCG_GM is a voltage to be supplied to memory cells MC on a given page as a write target.

As will be described later, a relationship of "voltage VCG_GM>voltage VCG_EV" holds.

Note that the voltage VREAD is a voltage at which the memory cell MC is turned on. The voltage VCGR is a voltage corresponding to the threshold level of a memory cell as a read target.

1-6. Controller 4

The controller 4 controls the operation of the whole NAND flash memory. That is, based on the above-mentioned address and command supplied from the host (not shown) via the data input/output circuit 3, the controller 4 executes operation sequences in a data write operation, data read operation, and data erase operation.

The controller 4 generates a block selection signal and column selection signal based on the address and operation sequence.

The controller 4 outputs the above-described block selection signal to the row decoder 2. The controller 4 also outputs the column selection signal to the sense amplifier 5. The column selection signal is a signal for selecting a column direction of the sense amplifier 5.

Furthermore, in a read operation for the memory cell MC having a threshold value positioned at the erase level, the controller 4 controls, based on, e.g., the number of ON cells of each page, the value of the program voltage to be supplied to the memory cells MC arranged in the same page.

For example, if the number of memory cells MC having defective characteristics due to deterioration is large, the controller 4 decreases the program voltage. By contrast, the controller 4 increases the program voltage for the memory cell MC having a good memory characteristic.

In addition, the controller 4 controls the value of the erase voltage in accordance with the deterioration degree of the memory cells MC arranged in a plurality of pages.

For example, if the number of memory cells MC having defective characteristics due to deterioration is large, the controller 4 increases the erase voltage. By contrast, the controller 4 decreases the erase voltage for the memory cell MC having a good memory characteristic.

1-7. Sense Amplifier 5

In data read, the sense amplifier 5 senses and amplifies data read from the memory cell MC to the bit line BL. In data program, the sense amplifier 5 transfers program data to the corresponding bit line BL. More specifically, after precharging the bit line BL to a predetermined voltage, the sense amplifier 5 discharges the bit line BL, and senses the discharged state of the bit line BL. That is, the sense amplifier 5 amplifies the voltage of the bit line BL and senses data of the memory cell MC.

Note that data read and program in the first embodiment are simultaneously performed for all the bit lines BL. The arrangement of the sense amplifier 5 will be explained below.

1-7-1. Arrangement of Sense Amplifier 5
1-7-1-1. Arrangement of Sense Amplifier 5

FIG. 4 shows the sense amplifier 5 capable of all-bit read and program. As shown in FIG. 4, the sense amplifier 5 includes n-channel MOS transistors 20 to 23, 25, 26, and 28 to 33, a p-channel MOS transistor 24, and a capacitor element 27.

Note that in the following description, the threshold potential of a MOS transistor is represented by attaching the reference numeral of the MOS transistor to a threshold potential Vth of the MOS transistor. For example, the threshold potential of the MOS transistor 22 is Vth22.

One end of the current path of the MOS transistor 20 is connected to the bit line BL, the other end is connected to a node N1, and a signal BL5 is supplied to the gate. The signal BL5 is a signal which is changed to level "H" in a read operation and write operation, thereby making the bit line BL and sense amplifier 5 connectable to each other.

One end of the current path of the MOS transistor 21 is connected to the node N1, the other end is grounded (a voltage VLSA), and a signal BLV is supplied to the gate.

One end of the current path of the MOS transistor 22 is connected to the node N1, the other end is connected to SCOM, and a signal BLC is supplied to the gate. The signal BLC is a signal for clamping the bit line BL at a predetermined potential. Assuming that signal BLC=voltage (Vblc+Vth22) is applied to the MOS transistor 22, the potential of the bit line BL becomes the voltage Vblc.

One end of the current path of the MOS transistor 23 is connected to SCOM, the other end is connected to one terminal of the MOS transistor 24, and signal BLX=voltage (Vblc+Vth23+BLC2BLX) is supplied to the gate.

The voltage BLC2BLX is a guard-band voltage for transferring a voltage VDD to SCOM, and is a voltage for making the current driving power of the MOS transistor 23 higher than that of the MOS transistor 22.

A voltage VHSA (=voltage VDD) is supplied to the other end of the current path of the MOS transistor 24, and a signal INV is supplied to the gate. Note that the MOS transistor 24 may also be omitted.

One end of the current path of the MOS transistor 25 is connected to the node SCOM, the other end is connected to SEN (a sensor), and signal XXL=voltage (Vblc+Vth25+BLC2BLX+BLX2XXL) is supplied to the gate.

Note that a voltage higher by the voltage BLX2XXL than that of the MOS transistor 23 is supplied to the gate of the MOS transistor 25. The voltage BLX2XXL is a guard-band voltage for transferring electric charges stored in SEN to SCOM.

A voltage relationship "signal BLC<signal BLX<signal XXL" holds between the signals BLC, BLX, and XXL. That is, the current driving power of the MOS transistor 25 is higher than that of the MOS transistor 23.

This is so because when sensing data "1", the potential of the node SEN is preferentially supplied to the bit line BL by making an electric current allowed to flow by the MOS transistor 25 larger than that allowed to flow by the MOS transistor 23.

One end of the current path of the MOS transistor 26 is connected to SCOM, the other end is grounded (a voltage SRCGND), and the signal INV is supplied to the gate. Also, a clock CLK (=voltage (Vblc+BLC2BLX)) is supplied from a node N2 to one electrode of the capacitor element 27, and the other electrode is connected to the node SEN. Note that the MOS transistor 26 may be omitted.

The clock CLK has a function of boosting the potential of the node SEN. One end of the current path of the MOS transistor 28 is connected to the node N2, and a signal SEN is supplied to the gate. That is, the MOS transistor 28 is turned on or off in accordance with the potential of the node SEN.

One end of the current path of the MOS transistor 29 is connected to the other terminal of the MOS transistor 28, the other end of the current path is connected to a node N3, and a signal STB is supplied to the gate.

One end of the current path of the MOS transistor 30 is connected to the node SEN, the other end of the current path is connected to the node N3, and signal BLQ=voltage (VDD+Vth30) is supplied to the gate.

One end of the current path of the MOS transistor 31 is connected to the node SEN, and a signal LSL is supplied to the gate. One end of the current path of the MOS transistor 32 is connected to the other end of the current path of the MOS transistor 31, the other end of the current path is grounded (the voltage VLSA), and the gate is connected to the node N3. The MOS transistors 31 and 32 are transistors for performing arithmetic operations on data.

One end of the current path of the MOS transistor 33 is connected to the node N3, the other end of the current path is connected to DBUS (the ground potential as needed), and a signal DSW is supplied to the gate. The controller 4 supplies the signal DSW. That is, the controller 4 turns on or off the MOS transistor 33.

Note that an interconnection to which the node N3 is connected will also be called LBUS in some cases. Note also that in read and program, charge share is prepared by supplying the voltage VDD from a MOS transistor (not shown) connected to LBUS to SEN via LBUS and the MOS transistor 30.

1-7-1-2. ON Condition of MOS Transistor 28

The ON/OFF conditions of the MOS transistor 28 will be explained below with reference to FIGS. 5A and 5B. In FIG. 5A shows a case in which the MOS transistor 28 has an n channel, and in FIG. 5B shows a case in which the MOS transistor 28 has a p channel.

As shown in FIG. 5A, the MOS transistor 28 is turned off during sensing under the following condition:

$$Vgs = Vsen - Vss < Vth28 \quad (1)$$

where Vsen: the voltage of SEN, and Vss: the voltage (0 V) of the node N2.

The relationship between the voltage of SEN and Vth28 after the signal XXL is changed to level "H" for only time T is represented by:

$$(Csen \cdot Vsen - Icell \cdot T)/Csen < Vth28 \quad (2)$$

where Csen: the capacitance of SEN, and Icell: an electric current flowing through the bit line BL. Note that the values of Csen and Vsen are set values.

Accordingly, if Icell meeting inequality (2) for the sense time T does not flow (if the value of Icell is small), it is determined that the memory cell MC as a read target is an OFF cell. On the other hand, if large Icell meeting inequality (2) flows, it is determined that the memory cell MC as a read target is an ON cell.

This similarly applies to FIG. 5B. In this case, the MOS transistor 28 is turned on under the following condition:

$$Vgs = VDD - Vsen > Vth28 \quad (3)$$

where VDD: the initial charge value of SEN.

The relationship between the voltage of SEN and Vth28 after the signal XXL is changed to level "H" for only the time T is represented by:

$$VDD - (Csen \cdot Vsen - Icell \cdot T)/Csen > Vth28 \quad (4)$$

Accordingly, if Icell meeting inequality (4) for the time T does not flow (if the value of Icell is small), it is determined that the memory cell MC as a read target is an OFF cell. On the other hand, if large Icell meeting inequality (4) flows, it is determined that the memory cell MC as a read target is an ON cell.

2. Reference Current Icell

The relationship between the reference current Icell and the period T during which the signal XXL is changed to level "H" will be explained below with reference to FIG. 6. As shown in FIG. 6, the Icell threshold value for ON/OFF determination can be changed by varying VSEN (the initial charge level) and the period T (sense period).

As shown in FIG. 6, the relationship is divided into patterns I to III.

Assume that the MOS transistor 28 has an n channel.

Pattern I

In this case, Vsen is V2, and the period T is T2. At this time, the reference current is Icell2.

That is, in a read operation in which Vsen is V2 and the period T is T2, the memory cell MC which allows Icell2 or more to flow is regarded as an ON cell, and the memory cell MC which allows an electric current smaller than Icell2 to flow is regarded as an OFF cell.

The same shall apply hereinafter. Other patterns will briefly be explained.

Pattern II

In a read operation in which Vsen is V1 (>V2) and the period T is T1 (>T2), the memory cell MC which allows Icell1 or more to flow is regarded as an ON cell, and the memory cell MC which allows an electric current smaller than Icell1 to flow is regarded as an OFF cell.

Pattern III

In a read operation in which Vsen is V1 and the period T is T2, the memory cell MC which allows Icell2 or more to flow is regarded as an ON cell, and the memory cell MC which allows an electric current smaller than Icell2 to flow is regarded as an OFF cell.

3. Timing Chart

Next, the relationship between Icell explained above and the signal XXL will be explained below with reference to FIG. 7. FIG. 7 is a timing chart showing the change in voltage of the node SEN in a read operation.

The ordinate indicates the voltage level of the bit line BL and the signal XXL, and the abscissa indicates time t.

As shown in FIG. 7, when the signal XXL is set at level "H" until time t1 (e.g., the above-mentioned period T1), a good memory cell MC supplies the electric current Icell1 to the bit line BL, so the voltage of the node SEN abruptly decreases (the lower voltage line).

On the other hand, when the signal XXL is set at level "H" until time t2 (e.g., the above-mentioned period T2), a good memory cell MC supplies the electric current Icell2 (<Icell1) to the bit line BL. Therefore, the voltage of the node SEN does not decrease as described above, and the locus of the upper voltage line level is obtained.

When the period T during which the signal XXL is at level "H" is prolonged like T1→T2, the value of the electric current Icell flowing through the bit line BL reduces. That is, the reference current Icell decreases.

Accordingly, it is possible to clearly distinguish between a good memory cell MC and a memory cell MC having a deteriorated characteristic by setting a short period T and high reference current Icell.

FIG. 8 is a conceptual view when a read operation is performed for each page with respect to the memory cells MC having a threshold value positioned at the erase level for each page. For example, the MOS transistor 25 is turned on for a time t1 (the period T1) by the signal XXL.

FIG. 8 is a conceptual view when the sense amplifier 5 reads all the bit lines BL for the memory cells MC formed in, e.g., page 0.

As shown in FIG. 8, the electric current Icell1 is read to, e.g., the bit lines BL (the bit lines BL0, BL1, and BL(n−2) to BLn) except for the bit lines BL2 and BL3.

Thus, it is determined that the characteristic of the memory cell MC is good when the number of the electric currents Icell1 is large in each page.

The controller 4 similarly manages data (to be referred to as flag information hereinafter) indicating the ratio of the number of bit lines BL through which the electric current Icell1 flows to the number of all bit lines BL, for other pages as well.

4. Management Information

The management information held by the controller 4 will now be explained with reference to FIG. 9. FIG. 9 is a conceptual view showing the flag information, and the values of program and erase voltages based on the information. The flag information is stored in the management area as described earlier.

Referring to FIG. 9, the flag information, program voltage, and erase voltage are arranged in the row direction. Note that a reference current for determining "1" or "0" of the memory cell MC is Icell1.

As shown in FIG. 8, when the electric current Icell1 is supplied to many bit lines BL, i.e., when flag information="H", the controller 4 determines that the characteristic of the memory cell MC is good, and sets, e.g., a voltage Vpgm1 as the program voltage for the page in which flag information="H" is obtained, and Vera2 as the erase voltage.

On the other hand, when an electric current smaller than the electric current Icell1 flows through most bit lines BL, i.e., when flag information="L", the controller 4 determines that the characteristic of the memory cell MC has deteriorated, and sets, e.g., a voltage Vpgm2 (<Vpgm1) as the program voltage for the page in which flag information="L" is obtained, and a voltage Vera2 (>Vera1) as the erase voltage.

Note that the flag information has two levels "H" and "L" in this embodiment, but the present invention is not limited to this.

That is, a plurality of steps may also be set for the value of the program voltage in accordance with the number of cells found to be OFF cells. More specifically, a plurality of steps can be set such that the program voltage Vpgm1 is set if the number of OFF cells is less than $1\times10^3$, the program voltage Vpgm2 is set if the number of OFF cells is less than $2\times10^3$, a program voltage Vpgm3 is set if the number of OFF cells is less than $3\times10^3$, and so on. Note that voltage Vpgm1>voltage Vpgm2>voltage Vpgm3.

5. Flowchart

The operation of the controller 4 will be explained below with reference to FIG. 10.

FIG. 10 is a flowchart of performing a write operation based on the flag information obtained by above-mentioned gm read for each page. Note that a memory controller (or host) (not shown) issues a command for executing the write operation, and the controller 4 executes the following operation in accordance with this command.

The controller 4 having received the command executes the write operation after gm read.

As shown in FIG. 10, the controller 4 first issues the write command CMD, and then executes gm read for each page (step S0). Based on the flag information obtained as a result of the read operation, the controller 4 executes a write operation for each page (step S1). That is, as described above, the controller 4 generates an optimum program voltage based on the flag information, and supplies the voltage to the memory cell MC. At this write timing, the controller 4 writes the above-mentioned flag information in the management area.

After that, if program verify has passed (YES in step S2), the controller 4 determines that the write operation is complete, and terminates the operation.

On the other hand, if program verify has failed (NO in step S2), the controller 4 determines that the write operation is incomplete, and executes the write operation again.

Note that the controller 4 temporarily holds the flag information obtained by Gm read in step S0 in, e.g., an internal latch unit of the sense amplifier 5, or in an internal latch unit of the memory controller (not shown).

6. Program Voltage

Step-up of the program voltage will be explained below with reference to FIGS. 11A and 11B. Step-up is an operation which is mainly performed to supply a higher voltage when program verify has failed.

Figure 11A:
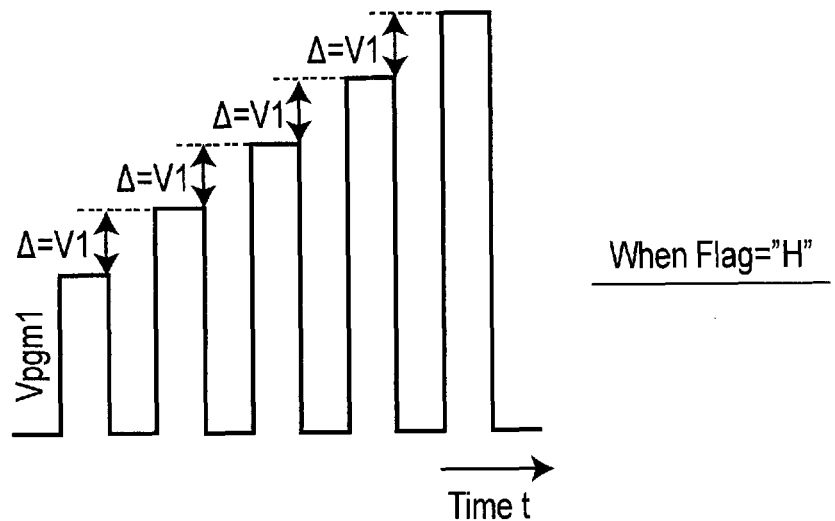
FIGS. 11A and 11B are conceptual views showing step-up in the write operation according to the first embodiment.

FIG. 11A is a conceptual view of the step-up voltage when the flag information is "H".

Figure 11B:
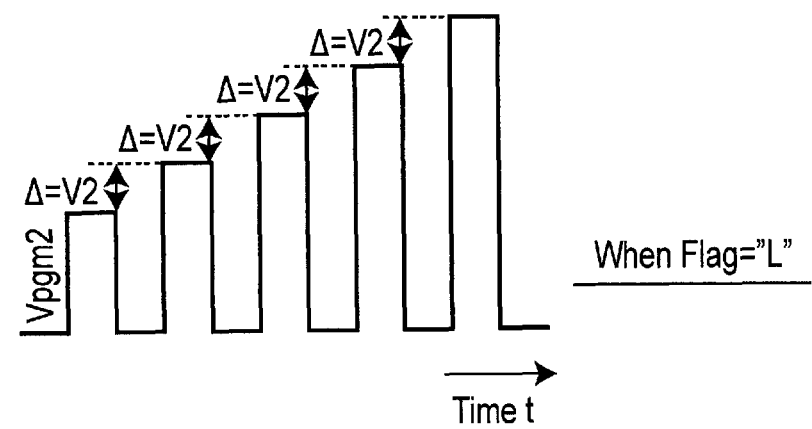

FIG. 11B is a conceptual view of the step-up voltage when the flag information is "L".

As shown in FIG. 11A, the value of a rising program voltage, i.e., a Δ value is V1.

On the other hand, as shown in FIG. 11B, the value of the rising program voltage, i.e., the Δ value is V2 smaller than V1.

7. Timing Chart for Gm Read

Next, the magnitude of a voltage to be supplied to the gate of the memory cell MC during Gm read will be explained with reference to FIG. 12. To compare the magnitudes of voltages, the explanation will be made by taking the voltage VCG_EV as an example.

As shown in FIG. 12, the voltage to be supplied to the gate during Gm read is higher than the voltage VCG_EV for erase.

As shown in FIG. 3, therefore, Gm read can be performed in a position (the voltage V1) higher than the upper-end voltage (Evfy) in the erase-level threshold distribution.

Note that in gm read and erase verify, a value larger than the voltage to be supplied to the gate of the memory cell MC is supplied to the source terminal.

<Effects of First Embodiment>

Effects (1) to (3) below can be obtained by the nonvolatile semiconductor storage device according to the first embodiment.

(1) The program time and erase time can further be shortened (part 1).

This effect will be explained by taking a comparative example. Note that the same reference numerals denote the same arrangements in the comparative example.

This comparative example is binary data program. In binary data program, the lower bit is programmed first, and then the upper bit is programmed.

In the comparative example, based on the program result of this lower bit, the program voltage for the upper bit is decreased for the memory cell MC whose threshold level largely rises, and the upper-bit program voltage is increased for the memory cell MC whose threshold level does not largely rise. That is, this comparative example adopts the program method from the second time.

In the comparative example, therefore, program of the lower bit must be "0" like data "0Δ" (Δ: the upper bit, "0" or "1"). Consequently, in the program method of the comparative example, no appropriate program method can be adopted for the second time unless the lower bit is data "0" as described above.

That is, since this program method depends on program data, no satisfactory flag information can be obtained if the program data contains little data "0" (part 1).

In addition, when adopting the above-mentioned program method, the calculation of an optimum program voltage is based on the result of program verify of the lower data, so the optimum program voltage is used in program from the second time.

That is, no optimum program voltage can be adopted in the first program. Accordingly, the write operation sometimes takes a long time depending on program data (part 2).

In the nonvolatile semiconductor storage device according to the first embodiment, however, the read operation (gm read) is executed for the erase-level memory cell MC before the write operation as described above. Consequently, the controller 4 obtains more flag information than that of the comparative example.

Accordingly, an optimum program voltage matching the characteristic of the memory cell MC can be supplied to the first write operation, i.e., the lower-bit data.

Since the optimum program voltage can be supplied, the time of the write operation can be shortened.

Furthermore, the nonvolatile semiconductor storage device according to the first embodiment can increase the speed of the write operation. For example, when the memory cell MC holds 1-bit data, program is performed from "1" (the erase level: level E) to "0". When the memory cell MC holds 2-bit data, program is performed from "11" (the erase level: level E) to "00" (level C) at once without programming the lower bit.

Also, the time of the erase operation can be shortened because the erase voltage corresponding to the characteristic of the memory cell MC can be supplied.

(2) The speed of the write operation can be increased (part 2).

In the nonvolatile semiconductor storage device according to the first embodiment, the characteristic of the erase-level memory cell MC is used as the flag information, so the flag information does not vary unlike in the comparative example. Therefore, the write operation can be executed at high speed for all upper bits.

(3) The increase in ICCO can be suppressed.

The nonvolatile semiconductor storage device according to the first embodiment reads all the bit lines at the same time.

When electric currents are supplied to all the bit lines BL, however, an electric current flowing through the whole memory cell array 1 increases. This increases the power consumption.

In the first embodiment, it is already known that the read operation is performed on the erase-level memory cells MC. Therefore, although the flag information certainly reduces, the electric current flowing through the memory cell array 1 can be suppressed by the reducing the number of bit lines BL as read targets.

In this case, the controller 4 reduces the number of bit lines BL as read targets by supplying a predetermined signal to the sense amplifier 5 which does not need to operate.

First Modification

A nonvolatile semiconductor storage device according to a modification (to be referred to as the first modification hereinafter) of the first embodiment will now be explained below.

In the nonvolatile semiconductor storage device according to the first modification, a write operation on the memory cell MC capable of holding 2-bit data (lower-bit data and upper-bit data) will be explained.

The write operation according to the first modification will be explained with reference to FIG. 13.

FIG. 13 is a flowchart showing the write operation.

Note that following the write command, the memory controller issues an address, lower-bit data, and upper-bit data to the nonvolatile semiconductor storage device. The lower bit and upper bit are allocated by the address.

As shown in FIG. 13, when it is necessary to program lower-bit data, the controller 4 first performs gm read, programs the lower bit, and then executes an IDL (Internal Data Load) operation (YES in step S10). That is, the controller 4 confirms the characteristics of the memory cell MC as a program target by using gm read, and executes the program operation after that.

Then, the controller 4 performs an operation of programming upper-bit data (step S11). The controller 4 executes this program operation after grasping the threshold distribution after the lower bit obtained by the above-mentioned IDL operation is programmed.

Subsequently, the controller 4 executes program verify. If the program verify has passed (YES in step S12), the controller 4 terminates the write operation. If the program verify has failed, the controller 4 reprograms the upper-bit data.

Note that if it is unnecessary to program the lower-bit data (NO in step S10), i.e., as described above, even when, e.g., programming data from level E to level C at once, the above-mentioned IDL must be performed.

Then, the controller 4 performs the IDL operation and gm read on a page as a program target (step S13), and then programs the upper-bit data (step S11).

As described above, it is possible to program data to the upper bit (e.g., level C) at once by supplying an appropriate voltage without programming the lower-bit data. Therefore, increasing the speed of the write operation can be implemented.

Also, when using the flag information adopted in this embodiment, it is possible to calculate an erase voltage in an optimum erase operation, and calculate a Δvoltage (additional amount) optimum for an erase operation from the second time, in accordance with the characteristic of the memory cell MC.

Second Modification

A nonvolatile semiconductor storage device according to a modification (to be referred to as the second modification hereinafter) of the first embodiment will be explained below with reference to FIGS. 14, 15A and 15B. This modification differs from the first embodiment in that the sense amplifier 5 executes data read and program on ½ of all the bit lines BL at one time.

In the following modification, only arrangements different from those of the first embodiment will be explained.

1. Sense Amplifier 5

FIG. 14 shows the arrangement of the sense amplifier 5. The sense amplifier 5 performs data read and program on one of two adjacent bit lines BL.

Pairs of two adjacent bit lines BL are a pair of bit lines BL0 and BL1, a pair of bit lines BL2 and BL3, a pair of bit lines BL4 and BL5, and so on. That is, read and program are performed for n/2 bit lines BL of n bit lines BL at once.

1.1. Arrangement of Sense Amplifier 5

As shown in FIG. 14, the sense amplifier 5 includes a primary data cache (PDC) 430, a secondary data cache (SDC) 431, three dynamic data caches (DDCs) 433 (433-1 to 433-3), and a temporary data cache (TDC) 434.

Note that the dynamic data caches 433 and temporary data cache 434 need only be formed as needed.

Note also that the dynamic data caches 433 can also be used as caches for holding data for programming an intermediate potential (VQPW) between VDD (a high potential) and VSS (a low potential) to a bit line during program.

The primary data cache 430 includes clocked inverters CLI1 and CLI2 and an n-channel transistor NMOS5. The secondary data cache 431 includes clocked inverters CLI3 and CLI4 and n-channel transistors NMOS6 and NMOS7.

The dynamic data cache 433 includes n-channel transistors NMOS4 and NMOS9.

The temporary data cache 434 includes a capacitor C1.

In this arrangement, the temporary data cache 434 functions as a node for sensing read data (the voltage of this node will be referred to as Vsen hereinafter).

In a sense operation, after charge share by the temporary data cache 434 and bit line BL, read data is determined in accordance with the voltage value of the temporary data cache 434.

Conditional expressions when NMOS10 is turned on to perform charge share in a read operation will be presented below.

First, the ON condition of NMOS10 in a read operation is represented by:

$$(Vsen+Vth10)-Vbl-Vth10 \quad (5)$$

where Vbl is the voltage of the bit line BL.

Also, electric charge stored in the bit line BL after charge share is represented by:

$$Q_{BL}=C_{BL} \cdot V_{Clamp}-ICell \cdot T_{sense} \quad (6)$$

where $Q_{BL}$: the electric charge of the bit line BL, $C_{BL}$: the bit-line capacitance, $V_{clamp}$: a voltage to be supplied to the gate of NMOS10, and $T_{sense}$: a period during which a signal BLCLAMP is at level "H".

Dividing the two sides of equation (6) by $C_{BL}$ yields:

$$Vbl=Q_{BL}/C_{BL}=V_{clamp}-Icell \cdot T_{sense}/C_{BL} \quad (7)$$

In addition, the ON condition of NMOS10 is obtained by substituting equation (7) into inequality (5). This is inequality (8) below:

$$(Vsen+Vth10)-V_{Clamp}-Icell \cdot T_{sense}/C_{BL}>Vth10 \quad (8)$$

To raise the reference voltage Icell as shown in FIG. 3, it is necessary to decrease the initial charge level of Vsen, and shorten the value of $T_{sense}$.

Note that the circuit configuration of the primary data cache 430, secondary data cache 431, dynamic data caches 433, and temporary data cache 434 is not limited to that shown in FIG. 14, and another circuit configuration may also be adopted.

Note also that an n-channel MOS transistor is used as the transistor for controlling data input/output in the data cache in the example shown in FIG. 14, but it is also possible to use a p-channel MOS transistor.

The sense amplifier is connected to an even-numbered bit line BLe and odd-numbered bit line BLo by n-channel MOS transistors HN2e and HN2o, respectively. Signals BLSe and BLSo are respectively input to the gates of the transistors HN2e and HN2o. The sources of n-channel MOS transistors HN1e and HN1o are respectively connected to the even-numbered bit line BLe and odd-numbered bit line BLo. Signals BIASe and BIASo are respectively input to the gates of the transistors HN1e and HN1o, and a signal BLCRL is input to the drains.

2. Read Operation

A read operation performed by the sense amplifier 5 according to the modification will be explained below with reference to FIGS. 15A and 15B. FIG. 15A is a timing chart showing signals in the sense amplifier 5 and the voltage levels of the bit line BL in the read operation. FIG. 15B is a timing chart of signals when transferring read data to the PDC 430.

Note that in this explanation, the bit line BLe is a selected bit line, and the bit line BLo is an unselected bit line. That is, the bit line BLo has the voltage VSS (=0 V).

Note also that the controller 4 controls the voltage levels of the individual signals.

Figure 15A:
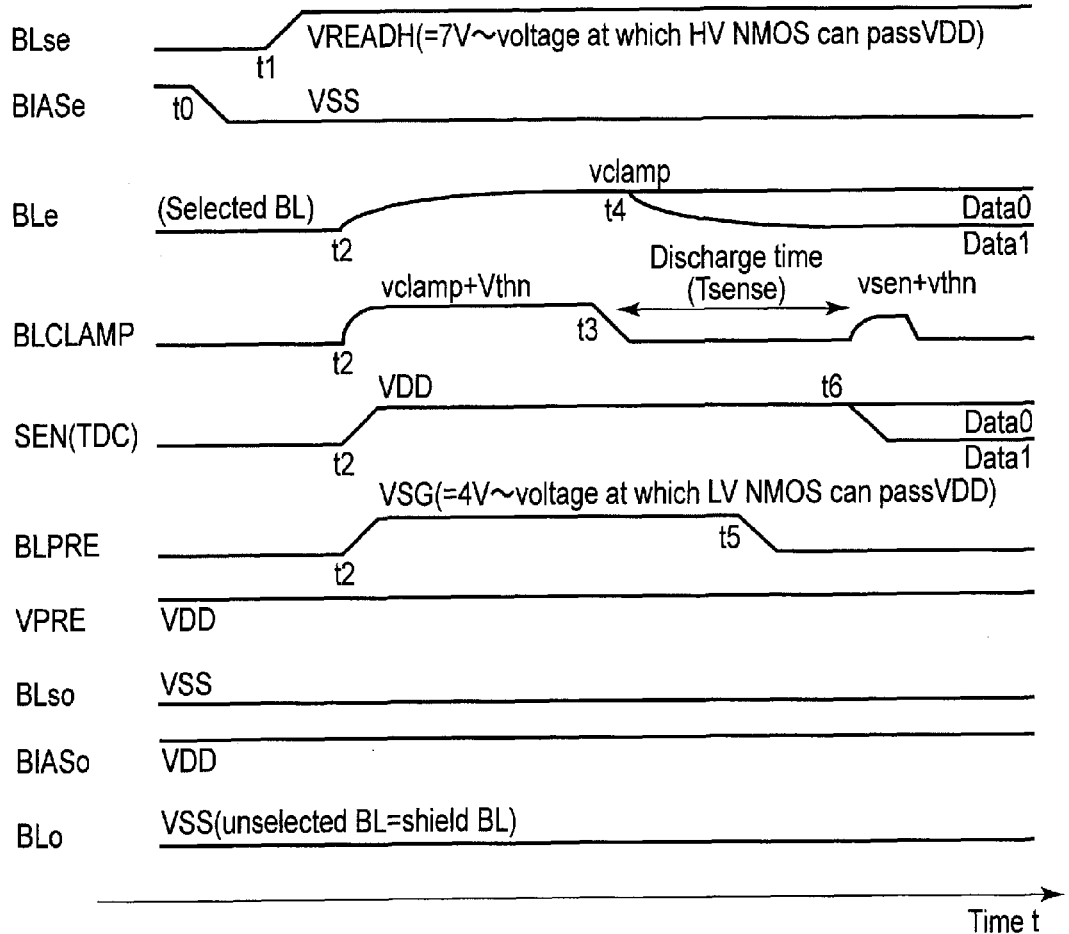
FIGS. 15A and 15B are timing charts showing a read operation according to the first modification of the first embodiment.

As shown in FIG. 15A, the voltage level of the signal BIASe is changed to "L" at time t0. After that, the voltage level of the signal BLSe is changed to "H" at time t1.

Consequently, the bit line BLe and NMOS10 are electrically connected.

Then, the voltage level of a signal BLCLAMP is changed to "H", i.e., to (voltage Vclamp+Vth10). Accordingly, the potential of the bit line BL rises from 0 V to a voltage Vclamp at time t2.

Also, the value of Vsen is set at the voltage VDD by changing the voltage level of a signal VPRE to "H" at time t2.

After that, the voltage level of the signal BLCLAMP is changed to "L" at time t3. That is, charge performed to the bit line BL via NMOS11 is terminated.

After that, the voltage level of the word line WL (not shown) is changed to "H", that is, a voltage VCGR (e.g., 0 V) is transferred to a selected word line WL, and VREAD is transferred to an unselected word line WL. If the memory cell MC is turned on, the potential of the bit line BLe decreases from the voltage Vclamp to 0 V at time t4, thereby performing discharge.

On the other hand, if the memory cell MC is kept OFF, the bit line BLe maintains the voltage Vclamp even after time t4.

After that, the voltage level of a signal BLPRE is changed to "L" at time t5.

Also, at time t6, the voltage level of the signal BLCLAMP is changed to "H", i.e., to voltage (Vsen+Vth10). That is, gm read is executed here by using the above-described charge share.

Then, gm read is completed by sensing the value of Vsen after the charge share.

As shown in FIG. 6, gm read is performed by changing the initial charge of the node SEN and the charge time T in this embodiment as well.

Next, the voltage operation of each signal when loading read data will be explained with reference to FIGS. 15B and 14.

Figure 15B:
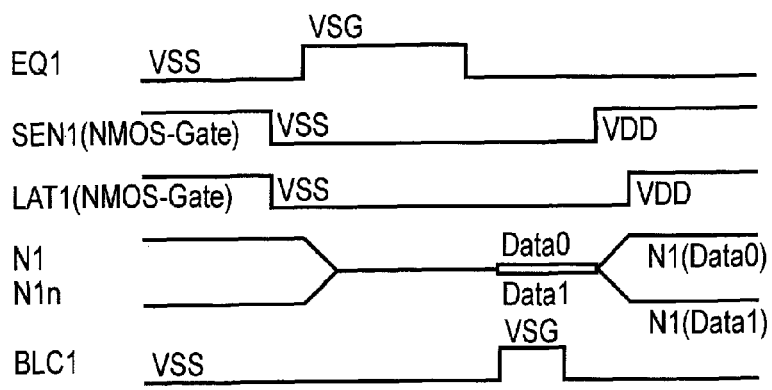

As shown in FIG. 15B, before loading read data, voltage level "H" is supplied to n-channel MOS transistors (not shown) forming the SEN1 and LAt1, while the voltage levels of signals BLC1 and EQ are set at "L".

In this case, the voltage level of the node N1 is set at "H" (the voltage level of the node N1n is set at "L").

Then, outputs from the latches (SEN1 and LAT1) are stopped by supplying voltage level "L" to the n-channel MOS transistors forming the SEN1 and LAT1.

Subsequently, the input terminals of the SEN1 and LAT1 are electrically connected by setting the voltage level of a signal EQ1 at "H". As a consequence, the voltage levels of the nodes N1 and N1n are given the same value (0 V in FIG. 15B). In this manner, the held data is reset.

After that, the read data is loaded into the PDC by setting the voltage level of the signal EQ1 at "L" again, and the voltage level of the signal BLC1 at "H".

For example, when the read data is "Data0" (the memory cell MC is holding data 0), the bit line BL maintains the voltage VDD ("H"), so the voltage level of the node N1 is "H".

On the other hand, when the read data is "Data1" (the memory cell MC is in the erased state), the bit line BL has a value close to 0 V ("L"), so the voltage level of the node N1 is "L".

After that, the read data is stored by supplying voltage level "H" to the n-channel MOS transistors forming the SEN1 and LAT1.

<Effects of Second Modification>

The nonvolatile semiconductor storage device according to the second modification can also achieve the same effects as effects (1) to (3) mentioned earlier.

That is, it is possible obtain, e.g., the effect of increasing the speeds of the write and erase operations.

Second Embodiment

Next, a nonvolatile semiconductor storage device according to the second embodiment will be explained with reference to FIGS. 16 to 19.

The nonvolatile semiconductor storage device according to the second embodiment has a shape in which memory cells MC are stacked in the normal direction of a semiconductor substrate. Even in this memory cell array shape, a controller 4 can supply an optimum program voltage and erase voltage. Note that only arrangements different from the above-mentioned embodiment will be explained.

1. Arrangement of Memory Cell Array 11 (Part 1)

A memory cell array 1 according to the second embodiment include, e.g., planes P0 and P1. The planes P0 and P1 each include a plurality of memory strings MS, and bit lines BL, word lines WL, and source lines CELSRC are electrically connected to the memory strings MS.

As will be described later, each memory string MS includes a plurality of memory cells MC connected in series, and the word line WL described above is connected to a control gate CG of the memory cell MC.

The memory cell array 11 includes the planes P0 and P1 in this embodiment, but the number of planes P held by the memory cell array 11 is not limited. Note that the planes P0 and P1 will simply be referred to as planes P when it is unnecessary to distinguish between them.

The arrangement of the plane P will be explained in detail below with reference to FIG. 16.

1.1<Sectional View of Sub Block BLK>

FIG. 16 is a conceptual view of a sectional view of the memory cell array 1, in which a bit line B0 is shown. As shown in FIG. 16, the bit line BL0 includes a plurality of memory strings MS, and this unit will be called a sub block SB.

A set of the sub blocks SB will be called a block BLK. That is, a set formed by a plurality of memory strings MS connected to each of bit lines BL1 to BLn (n: a natural number) is the block BLK.

The sub block SB includes, e.g., 12 memory strings MS, i.e., memory strings MS0 to MS11, but FIG. 16 shows the memory strings MS0 to MS5 for the sake of convenience.

<1.1.1> Memory Strings MS0 to MS5

As shown in FIG. 16, the memory strings MS0 to MS5 (thick frames) are formed along the sectional direction.

In each memory string MS, columnar semiconductor layers SC11 and SC12 are formed on a semiconductor layer BG in a third direction perpendicular to first and second directions. In the following description, the semiconductor layers SC11 and SC12 will simply be called semiconductor layers SC when it is unnecessary to distinguish between them.

Then, the semiconductor layers SC adjacent to each other along the first direction are connected by a joint portion JP formed in the semiconductor layer BG. For example, the semiconductor layers SC11 and SC12 are connected via a joint portion JP0 in the semiconductor layer BG. The U-shaped memory string MS0 is formed with this arrangement.

This arrangement similarly applies to a pair of semiconductor layers SC13 and SC14, . . . , a pair of semiconductor layers SC21 and SC22, so an explanation thereof will be omitted.

In addition, a plurality of polysilicon layers are formed along the third direction in each memory string MS. Some polysilicon layers function as the word lines WL, and other polysilicon layers function as selection signal lines SGS and SGD.

The selection signal lines SGS and SGD are formed to sandwich the word line WL. That is, when the number of word lines WL is, e.g., four as shown in FIG. 2, the word lines WL3, WL2, WL1, and WL0 and the selection signal line SGS are stacked in this order on the surface of the semiconductor layer BG with insulating films intervening between them, and the word lines WL4, WL5, WL6, and WL7 and the selection signal line SGD are similarly stacked in this order on the surface of the semiconductor layer BG with insulating films intervening between them.

Accordingly, a selection transistor ST1, memory cells MC7, MC6, . . . , MC1, and MC0, and a selection transistor ST2 are formed at the intersections of the semiconductor layers SC and the selection signal lines SGS and SGD and word lines WL.

Note that the selection signal lines SGS and SGD function as selection signal lines SGS and SGD for controlling whether to select the memory string MS.

FIG. 16 shows the arrangement in which the memory string MS0 includes the memory cells MC0 to MC7 as an example, but the present invention is not limited to this. In a write operation to be explained below, it is assumed that the memory string MS includes 48 memory cells MC, i.e., memory cells MC0 to MC47.

2. Program Method

The program method will now be explained with reference to FIG. 17. This explanation will be made by taking the memory string MS0 as an example. For example, the memory string MS0 includes the memory cells MC0 to MC47.

In the memory string MS0 as shown in FIG. 17, the controller 4 supplies an optimum program voltage Vpgm corresponding to the hierarchical layer of the memory cell MC.

For example, the program voltage Vpgm for the memory cells MC0, MC1, MC46, and MC47 is a voltage V1, the program voltage Vpgm for the memory cells MC12 to MC14 and MC33 to MC35 is a voltage V2, and the program voltage Vpgm for the memory cells MC22, MC23, MC24, and MC25 is a voltage V3. The relationship between the voltages V1, V2, and V3 is voltage V1<voltage V2<voltage V3.

This is so because the sizes of memory holes decrease and the memory cell characteristics deteriorate toward lower layers of the memory cells MC. This makes it necessary to apply higher voltages.

The program voltages V1 to V3 can be set at optimum values by using the above-mentioned flag information in the second embodiment as well.

Note that the program voltage Vpgm is also supplied to the memory cells MC not shown in FIG. 16 by taking account of the same item as above.

That is, the controller 4 supplies the program voltage Vpmg by which voltage V1<voltage Vpmg<voltage V2 to, e.g., the memory cells MC2 to MC11.

3. Arrangement of Memory Cell Array 1 (part 2)

Figure 18:
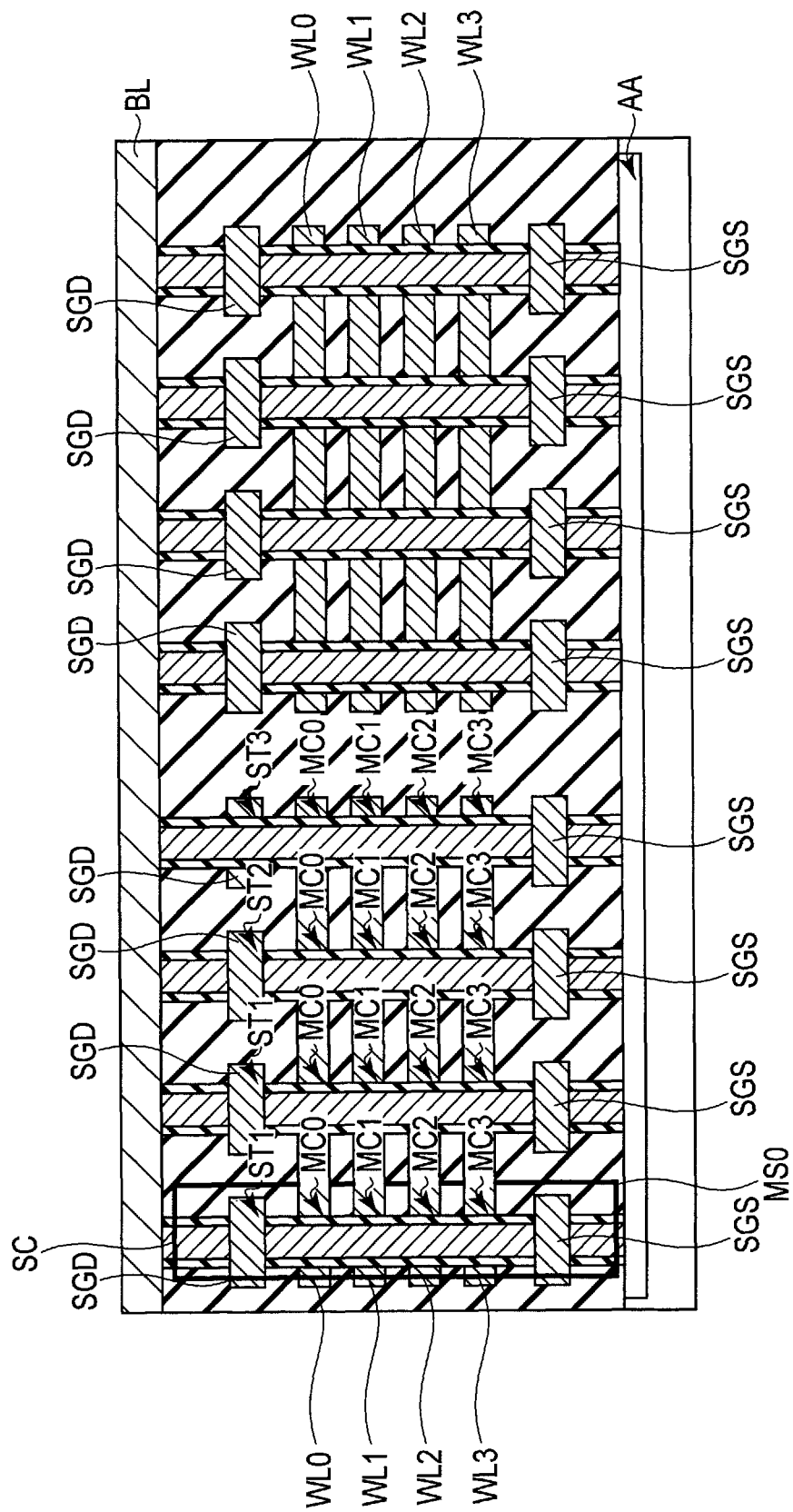
FIG. 18 is a sectional view of a memory cell array according to the second embodiment.

Next, the arrangement (part 2) of the memory cell array 1 will be explained with reference to FIG. 18. The difference of FIG. 18 is that adjacent memory cells MC are not connected by the backgate transistor BG.

That is, a plurality of memory strings MS each including selection transistors ST1 and ST2 and memory cells MC sandwiched between them are formed adjacent to each other on a well.

A method of applying a program voltage to the memory cell array 1 in this structure will be explained below.

4. Program Method

Figure 19:
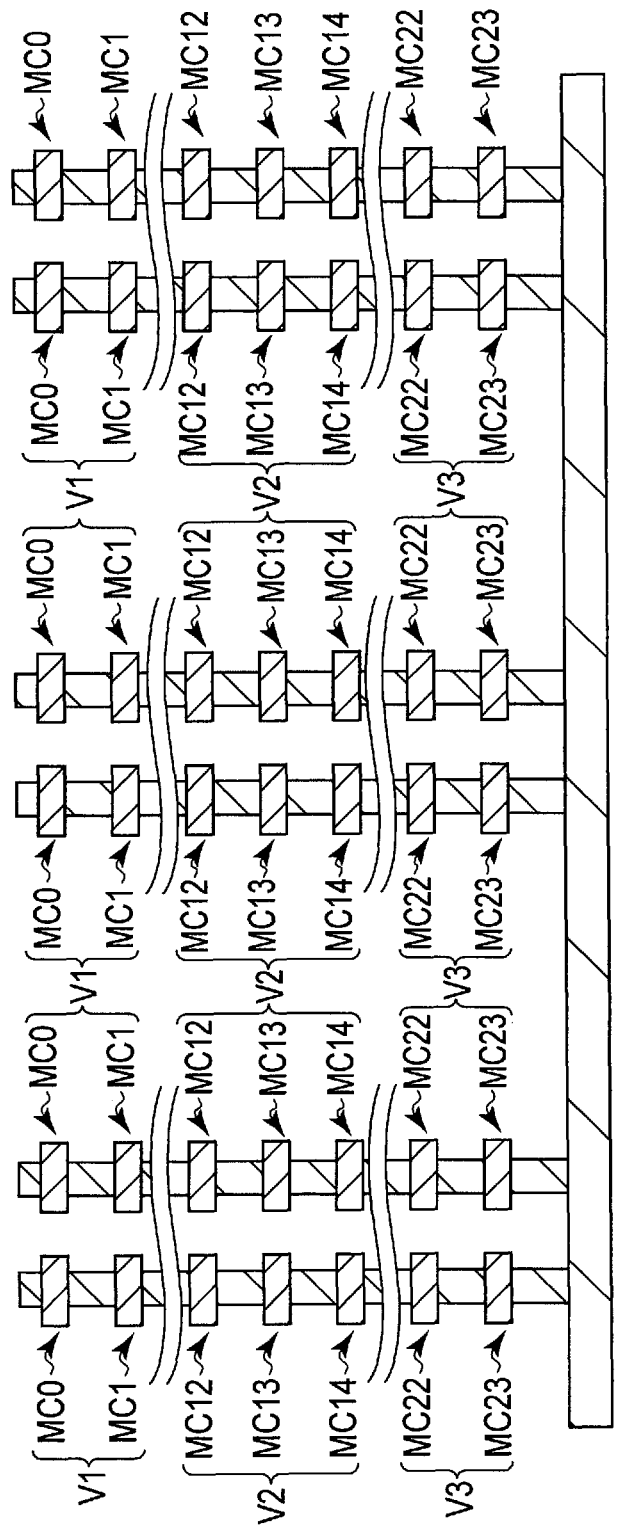
FIG. 19 is a conceptual view of a write operation according to the second embodiment.

The value of the program voltage Vpgm to be supplied to each memory cell MC in a write operation will be explained below with reference to FIG. 19.

The voltages V1 to V3 are supplied from the memory cells MC in upper layers to the memory cells MC in lower layers in this case as well.

Then, the initial program voltage Vpgm in the write operation can be optimized by using the flag information.

<Effects of Second Embodiment>

The nonvolatile semiconductor storage device according to the second embodiment can also achieve the same effects as effects (1) to (3) mentioned earlier.

That is, it is possible to obtain, e.g., the effect of increasing the speeds of the write and erase operations.

Third Embodiment

A nonvolatile semiconductor storage device according to the third embodiment will be explained below with reference to FIGS. 20A and 20B.

Figure 20A:
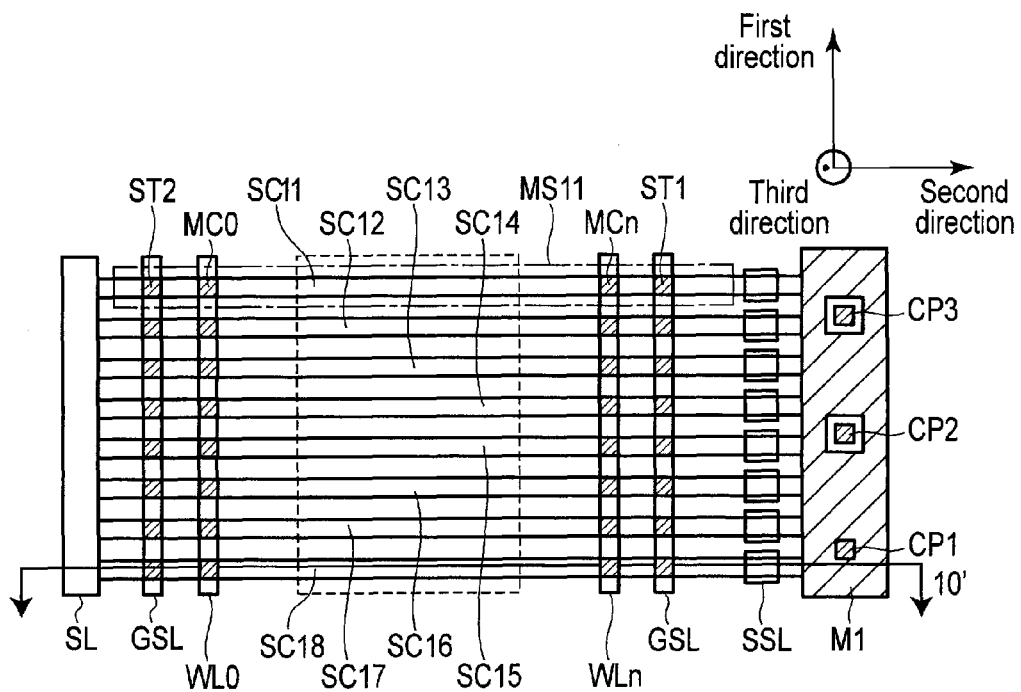
FIGS. 20A and 20B show a memory cell array according to the third embodiment.
Figure 20B:
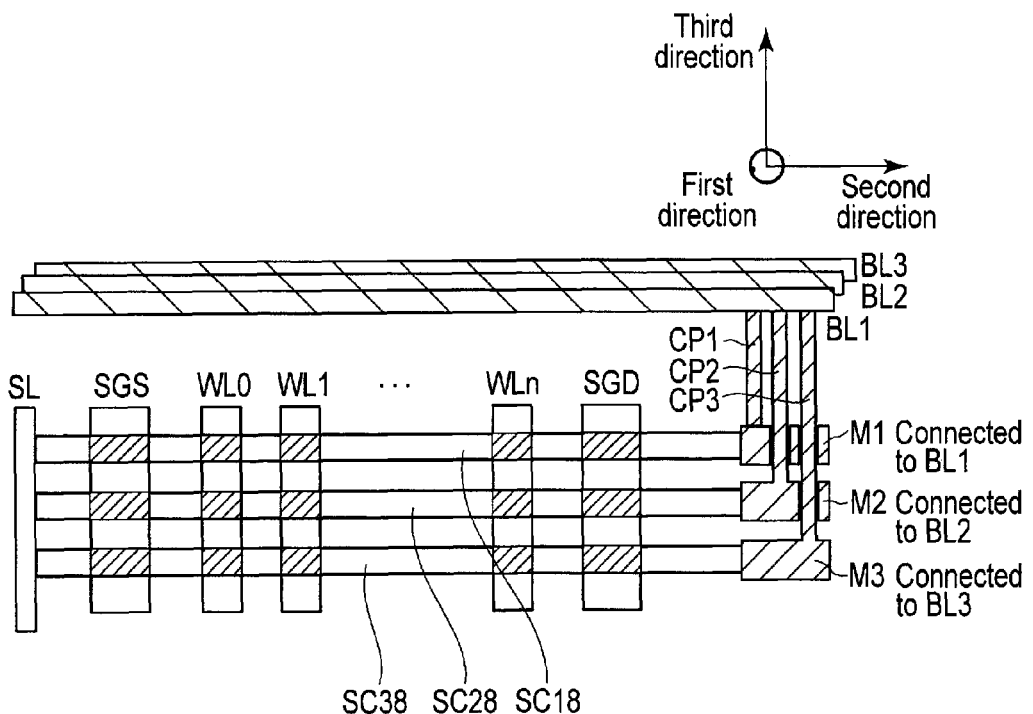

FIG. 20A is a plan view of plane 0 according to the third embodiment, and FIG. 20B is a sectional view of FIG. 20A. FIG. 20A shows only the uppermost layer, but a plurality of layers having the same arrangement are actually arranged backward on the drawing surface as shown in FIG. 20B. For the sake of convenience, it is assumed that three layers are arranged in this embodiment. The arrangement will be explained below for each semiconductor layer SC.

1. Configuration Example

Uppermost Layer (First Layer)

As shown in FIG. 20A, a metal layer M1, SSL, a signal line SGD, word lines WL0, ..., WLn, a signal line SGS, and a source line SL are arranged in the second direction.

Then, semiconductor layers SC11 to SC18 are formed to be terminated at the source line SL and metal layer M1, and to extend through the SSL, signal line SGD, word lines WL0, ..., WLn, and signal lines SGS in the second direction (the semiconductor layers SC11 to SC18 will simply be referred to as semiconductor layers SC when it is unnecessary to distinguish between them).

Note that the semiconductor layers SC11 to SC18 indicate semiconductor layers SC1 to SC8 in the first layer. Note also that memory strings MS11 to MS18 (to be described later) indicate memory strings MS1 to MS8 in the first layer.

That is, selection transistors ST2 (hatched portions in FIG. 20A) are formed at the intersections of the semiconductor layers SC and signal line SGS, and selection transistors ST1 (hatched portions in FIG. 20A) are formed at the intersections of the semiconductor layers SC and signal line SGD.

Also, memory cells MC (hatched portions in FIG. 20A) are formed at the intersections of the semiconductor layers SC and word lines WL0, ..., WLn.

That is, in the semiconductor layer SC11, for example, the memory string MS11 including the selection transistors ST1 and ST2, a plurality of memory cells MC0 to MCn having two ends sandwiched between the selection transistors ST1 and ST2, and the source line SL is formed.

Likewise, the memory strings MS12 to MS18 are formed in the regions of the semiconductor layers SC12 to SC18.

<Second Layer>

The second layer will briefly be explained below.

Semiconductor layers SC21 to SC28 (the semiconductor layers S21 to S27 are not shown in FIG. 20B) in the second layer from the uppermost layer are connected together by a metal layer M2, and then connected to a bit line BL2 via a contact plug CP2.

That is, the memory strings MS21 to MS28 stacked in the second layer form a sub block BLK2.

<Third Layer>

As shown in FIG. 20B, semiconductor layers SC31 to SC38 (the semiconductor layers SC31 to SC37 are not shown in FIG. 20B) in the third layer from the uppermost layer are connected together to a metal layer M3.

A contact plug CP3 extending through the metal layer and having an upper surface connected to a bit line BL3 is formed.

That is, the metal layer M3 is connected to the contact plug CP3. Accordingly, the memory strings MS31 to MS38 stacked in the third layer form a sub block BLK3.

Thus, a set of the sub blocks BLK1 to BLK3 form a block BLK.

A controller 4 can supply an optimum program voltage Vpmg to each memory cell MC by using the flag information in this arrangement as well.

<Effects of Third Embodiment>

The nonvolatile semiconductor storage device according to the third embodiment can also achieve the same effects as effects (1) to (3) mentioned earlier.

That is, it is possible to obtain, e.g., the effect of increasing the speeds of the write and erase operations.

Third Modification

A modification (to be referred to as the third modification hereinafter) of the first to third embodiments will be explained below with reference to FIGS. 21 and 22. In the third modification, a semiconductor apparatus including the nonvolatile semiconductor storage device according to the embodiment and a memory controller for controlling the device will be explained.

Figure 21:
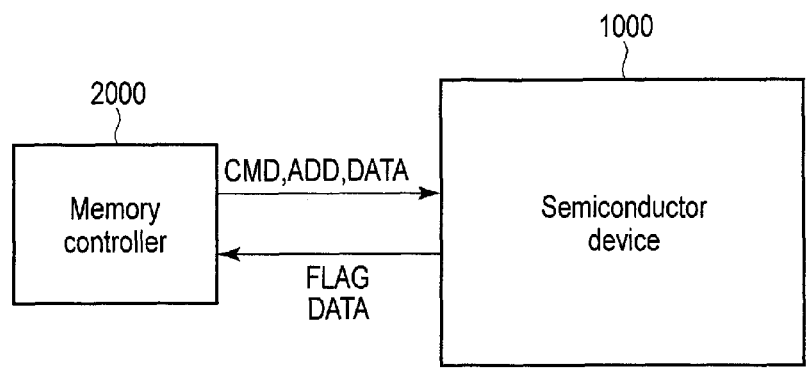
FIG. 21 is a conceptual view of a semiconductor apparatus according to the third modification.

FIG. 21 shows the whole semiconductor apparatus.

As shown in FIG. 21, the semiconductor apparatus includes a nonvolatile semiconductor storage device 1000 and memory controller 2000.

The memory controller 2000 issues the above-mentioned write command to the nonvolatile semiconductor storage device 1000.

This command contains an address and data as described previously.

That is, the nonvolatile semiconductor storage device 1000 executes the above-mentioned operation shown in FIG. 13 in accordance with the command issued from the memory controller 2000.

This operation will be explained with reference to FIG. 22.

Figure 22:
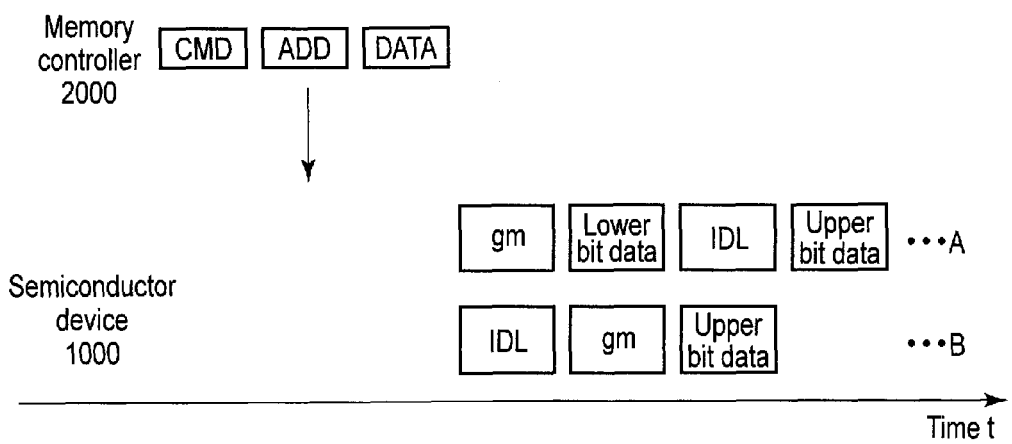
FIG. 22 is a conceptual view of data exchange in the semiconductor apparatus according to the third modification.

FIG. 22 is a conceptual view showing the exchange of data and the like between the memory controller 2000 and nonvolatile semiconductor storage device 1000.

As shown in FIG. 22, when the memory controller 2000 issues a command, address, and data, the nonvolatile semiconductor storage device 1000 executes operation "A" or "B".

"A" is the procedure of (YES in step S10)→step S11→step S12 in FIG. 13, and "B" is the procedure of (NO in step S10)→step S13→step S11→step S12 in FIG. 13.

Note that an external host (not shown) may also have the function of the memory controller 2000. In this case, the semiconductor device 1000 is made connectable to the external host and configures a memory system together with the host.

Note that the arrangement of the memory cell array 1 is described in, e.g., "Three-Dimensional Stacked Nonvolatile Semiconductor Memory", U.S. patent application Ser. No. 12/407,403, filed Mar. 19, 2009. The arrangement of the memory cell array 1 is also described in "Three-Dimensional Stacked Nonvolatile Semiconductor Memory", U.S. patent application Ser. No. 12/406,524, filed Mar. 18, 2009, "Nonvolatile Semiconductor Storage Device and Method of Manufacturing the Same", U.S. patent application Ser. No. 12/679,991, filed Mar. 25, 2010, and "Semiconductor Memory and Method of Manufacturing the Same", U.S. patent application Ser. No. 12/532,030, filed Mar. 23, 2009. These patent applications are hereby incorporated by reference herein in its entirety.

Note that the conditions of each embodiment according to the present invention are as follows.

(1) The read operation is as follows.

A voltage to be applied to a word line selected in a read operation at level A is, e.g., 0 to 0.55 V. However, the present invention is not limited to this, and the voltage may also be 0.1 to 0.24 V, 0.21 to 0.31 V, 0.31 to 0.4 V, 0.4 to 0.5 V, or 0.5 to 0.55 V.

A voltage to be applied to a word line selected in a read operation at level B is, e.g., 1.5 to 2.3 V. However, the present invention is not limited to this, and the voltage may also be 1.65 to 1.8 V, 1.8 to 1.95 V, 1.95 to 2.1 V, or 2.1 to 2.3 V.

A voltage to be applied to a word line selected in a read operation at level C is, e.g., 3.0 to 4.0 V. However, the present invention is not limited to this, and the voltage may also be 3.0 to 3.2 V, 3.2 to 3.4 V, 3.4 to 3.5 V, 3.5 to 3.6 V, or 3.6 to 4.0 V.

The time (tR) of the read operation may also be, e.g., 25 to 38 μs, 38 to 70 μs, or 70 to 80 μs.

(2) The write operation includes a program operation and verify operation as described above. The write operation is as follows.

A voltage to be initially applied to a word line selected in the program operation is, e.g., 13.7 to 14.3 V. However, the present invention is not limited to this, and the voltage may also be, e.g., 13.7 to 14.0 V or 14.0 to 14.6 V.

It is also possible to use different voltages as a voltage to be initially applied to a selected word line when programming an odd-numbered word line, and a voltage to be initially applied to a selected word line when programming an even-numbered word line.

When the program operation is ISPP (Incremental Step Pulse Program), an example of the step-up voltage is about 0.5 V.

A voltage to be applied to an unselected word line may also be, e.g., 6.0 to 7.3 V. However, the present invention is not limited to this, and the voltage may also be 7.3 to 8.4 V or 6.0 V or less.

A pass voltage to be applied may also be changed in accordance with whether an unselected word line is an odd-numbered word line or even-numbered word line.

The time (tProg) of the write operation may be, e.g., 1,700 to 1,800 μs, 1,800 to 1,900 μs, or 1,900 to 2,000 μs.

(3) The erase operation is as follows.

A voltage to be initially applied to a well which is formed in the upper portion of a semiconductor substrate and above which the aforementioned memory cell is arranged is, e.g., 12 to 13.6 V. However, the present invention is not limited to this, and the voltage may also be 13.6 to 14.8 V, 14.8 to 19.0 V, 19.0 to 19.8 V, or 19.8 to 21 V.

The time (tErase) of the erase operation may also be, e.g., 3,000 to 4,000 μs, 4,000 to 5,000 μs, or 4,000 to 9,000 μs.

(4) The structure of the memory cell is as follows.

The memory cell structure includes a charge storage layer formed on a 4- to 10-nm thick tunnel insulating film on a semiconductor substrate (silicon substrate). This charge storage layer can have a multilayered structure including a 2- to 3-nm thick insulating film made of, e.g., SiN or SiON, and 3- to 8-nm thick polysilicon. A metal such as Ru may also be added to the polysilicon. An insulating film is formed on the charge storage layer. This insulating film includes, e.g., a 4- to 10-nm thick silicon oxide film sandwiched between a 3- to 10-nm thick high-k film as a lower layer and a 3- to 10-nm thick high-k film as an upper layer. An example of the high-k film is HfO. Also, the thickness of the silicon oxide film can be made larger than that of the high-k film. A 30- to 70-nm thick control electrode is formed on the insulating film with a 3- to 10-nm thick work function adjusting material intervening between them. The work function adjusting material is a metal oxide film such as TaO or a metal nitride film such as TaN. W or the like can be used as the control electrode.

Furthermore, an air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claim is:

1. A nonvolatile semiconductor storage device comprising:
a memory cell;
a voltage generator configured to output a first voltage and a second voltage; and
a controller configured to execute a write operation, the write operation including a first read operation, a program operation, and a verify operation, the controller being configured to execute the first read operation before the program operation and the verify operation, the controller being configured to execute the first read operation by applying the first voltage to a gate of the memory cell, the controller being configured to execute an erase verify operation by applying the second voltage to the gate of the memory cell, the first voltage being higher than the second voltage.

2. The device according to claim 1, wherein the first read operation is an operation for applying a third voltage higher than the second voltage to the memory cell.

3. The device according to claim 2, further comprising a sense amplifier including a detection unit, and determining data corresponding to a current value read by the detection unit, wherein the sense amplifier includes a first MOS transistor having one terminal connected to the detection unit and the other terminal connected to a bit line, and the current value is adjustable depending on a time at which the first MOS transistor is turned on by the controller.

4. The device according to claim 3, further comprising a memory cell array, wherein the memory cell array includes a user area for programming data and a management area for programming management information, and when receiving a write command, the controller executes the first read operation to the memory cell to obtain a first result by the first read operation, stores the result to the management area while executing a write operation of lower bit data, and executes a write operation of upper bit data based on the result obtained by a third read operation of reading the result stored in the management area.

* * * * *